(12) United States Patent
Kawano

(10) Patent No.: US 11,387,786 B2
(45) Date of Patent: Jul. 12, 2022

(54) AMPLIFIER

(71) Applicant: FUJITSU LIMITED, Kawasaki (JP)

(72) Inventor: Yoichi Kawano, Setagaya (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 17/131,661

(22) Filed: Dec. 22, 2020

(65) Prior Publication Data

US 2021/0281224 A1    Sep. 9, 2021

(30) Foreign Application Priority Data

Mar. 4, 2020    (JP) .............................. JP2020-036860

(51) Int. Cl.
*H03F 3/04*    (2006.01)
*H03F 1/56*    (2006.01)
*H03F 3/68*    (2006.01)

(52) U.S. Cl.
CPC ................ *H03F 3/04* (2013.01); *H03F 1/56* (2013.01); *H03F 2200/06* (2013.01); *H03F 2200/387* (2013.01)

(58) Field of Classification Search
CPC .......... H03F 3/04; H03F 1/56; H03F 2200/06; H03F 2200/387; H03F 1/565; H03F 3/193; H03F 2200/09; H03F 2200/451; H03F 2203/21106; H03F 2203/21142; H03F 2203/45458; H03F 3/211; H03F 3/45183; H03F 3/604; H03F 1/223

USPC ............................... 330/124 R, 295, 84, 286
See application file for complete search history.

(56) References Cited

U.S. PATENT DOCUMENTS

| 6,137,367 A | * | 10/2000 | Ezzedine | ................ H03F 1/223 330/311 |
| 7,190,229 B1 | * | 3/2007 | Lautzenhiser | .......... H03F 3/211 330/124 R |
| 2002/0196086 A1 | | 12/2002 | Sowlati | |

FOREIGN PATENT DOCUMENTS

| JP | H11-145736 A | 5/1999 |
| JP | 2008-259239 A | 10/2008 |

* cited by examiner

*Primary Examiner* — Hieu P Nguyen
(74) *Attorney, Agent, or Firm* — Fujitsu Patent Center

(57) ABSTRACT

An amplifier includes amplifier circuits connected in series between a ground and a power supply, each amplifier circuit includes: a transistor; and a first capacitance, one end of which is connected to a drain of the transistor, a first amplifier circuit connected closest to the power supply includes a load connected between the drain of the transistor and the power supply, each of the amplifier circuits except for the first amplifier circuit includes a load connected between the drain of the transistor of an own amplifier circuit and a source of the transistor of an amplifier circuit adjacent to the own amplifier circuit, each of the amplifier circuits except for an amplifier circuit connected farthest from the power supply includes a second capacitance connected between the source of the transistor and the ground, and the second capacitance has a capacitance value larger than a capacitance value of the first capacitance.

10 Claims, 12 Drawing Sheets

AMPLIFIER

CROSS-REFERENCE TO RELATED APPLICATION

This application is based upon and claims the benefit of priority of the prior Japanese Patent Application No. 2020-36860, filed on Mar. 4, 2020, the entire contents of which are incorporated herein by reference.

FIELD

The embodiments discussed herein are related to an amplier.

BACKGROUND

Amplifiers that include a plurality of cascode-connected transistors are known.

Japanese Laid-open Patent Publication No. 2008-259239 is disclosed as related art.

SUMMARY

According to an aspect of the embodiments, an amplifier includes a plurality of amplifier circuits connected in series between a ground and a power supply, each of the plurality of amplifier circuits includes: a transistor; and a first capacitance, one end of which is connected to a drain of the transistor, a first amplifier circuit connected closest to the power supply among the plurality of amplifier circuits includes a load connected between the drain of the transistor and the power supply, each of the plurality of amplifier circuits except for the first amplifier circuit includes a load connected between the drain of the transistor of an own amplifier circuit and a source of the transistor of an amplifier circuit adjacent to the own amplifier circuit, each of the plurality of amplifier circuits except for an amplifier circuit connected farthest from the power supply includes a second capacitance connected between the source of the transistor and the ground, and the second capacitance has a capacitance value larger than a capacitance value of the first capacitance.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

The capacitance values of the transistors may have variations attributable to manufacturing. Therefore, when the capacitance values of cascode-connected upper and lower transistors are different from each other, the voltage waveform at the source and the voltage waveform at the drain sometimes become out of phase. When such a phase difference occurs, for example, an excessive voltage is likely to be generated between the source and the drain.

The present disclosure provides an amplifier that is not easily affected by variations in transistor capacitance values.

Hereinafter, embodiments of the present disclosure will be described.

Base station apparatuses used in 5G mobile communications and the like are equipped with a plurality of high-output-power amplifiers in a millimeter-wave band for a phased array that forms a long-distance coverage area. Therefore, it is desired that each amplifier can be inexpensively procured. For example, high output by an inexpensive device is expected.

Figure 1:
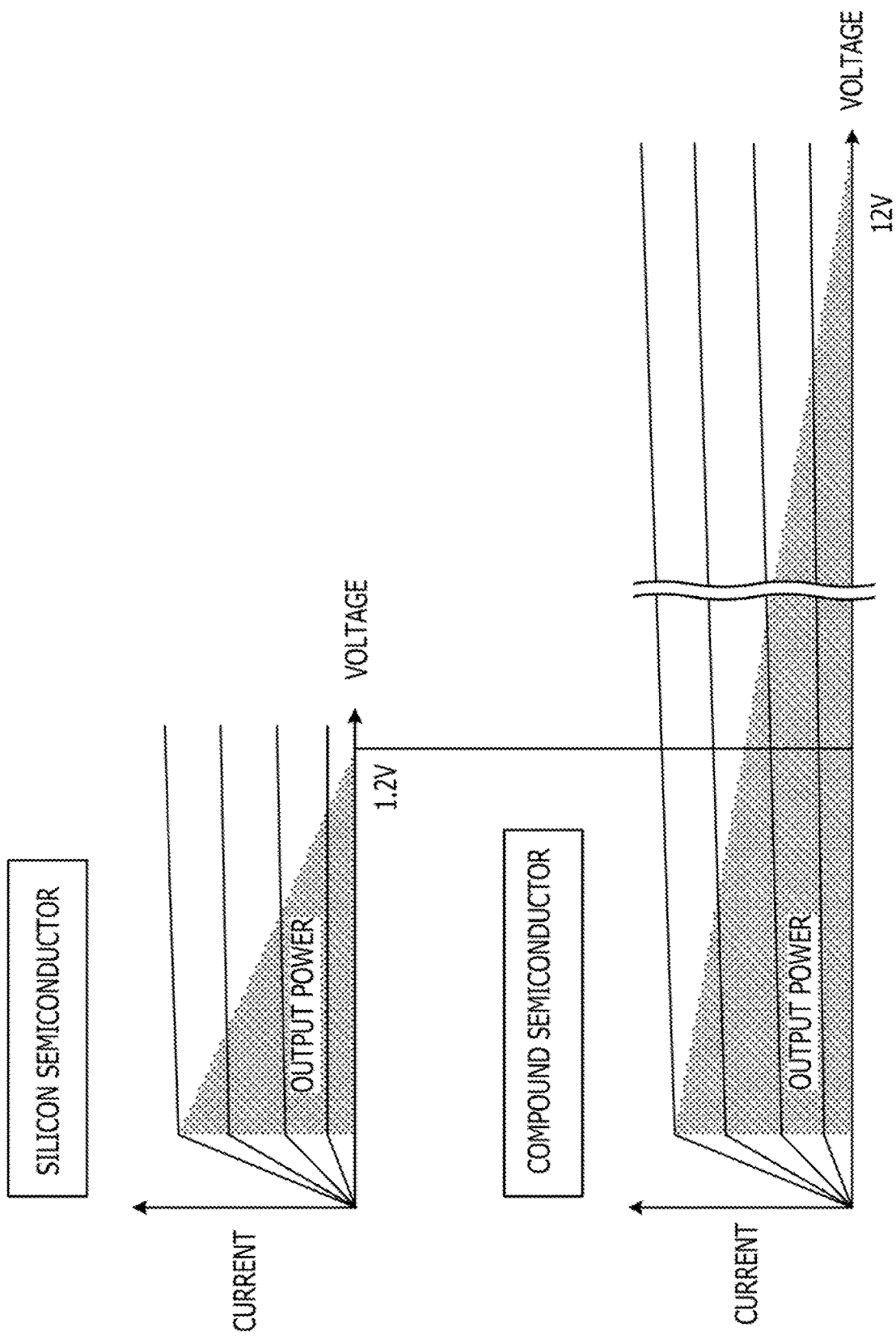
FIG. 1 is a brief explanatory diagram of the output power of an amplifier.

FIG. 1 is a brief explanatory diagram of the output power of an amplifier. The output power (=voltage Vds×current Ids) is determined according to the area separated by a load line of transistor's three-terminal characteristics (Ids–Vds). The upper part of FIG. 1 is a diagram exemplifying the three-terminal characteristics of a low-withstand voltage and inexpensive complementary metal oxide semiconductor (CMOS) device formed of a silicon semiconductor. The lower part of FIG. 1 is a diagram exemplifying the three-terminal characteristics of a high withstand voltage and expensive compound device formed of a compound semiconductor such as gallium nitride (GaN).

In the case of CMOS, the withstand voltage between the drain and the source is generally about 1.2 volts, whereas a withstand voltage of 12 volts or more can be ensured in the case of GaN. Comparing the CMOS device and the compound device with the same current value, the difference in voltage simply corresponds to the difference in output power. This means that, if the inexpensive CMOS device can be operated with a high voltage swing as in GaN, both of low cost and high output can be achieved at the same time.

Figure 2:
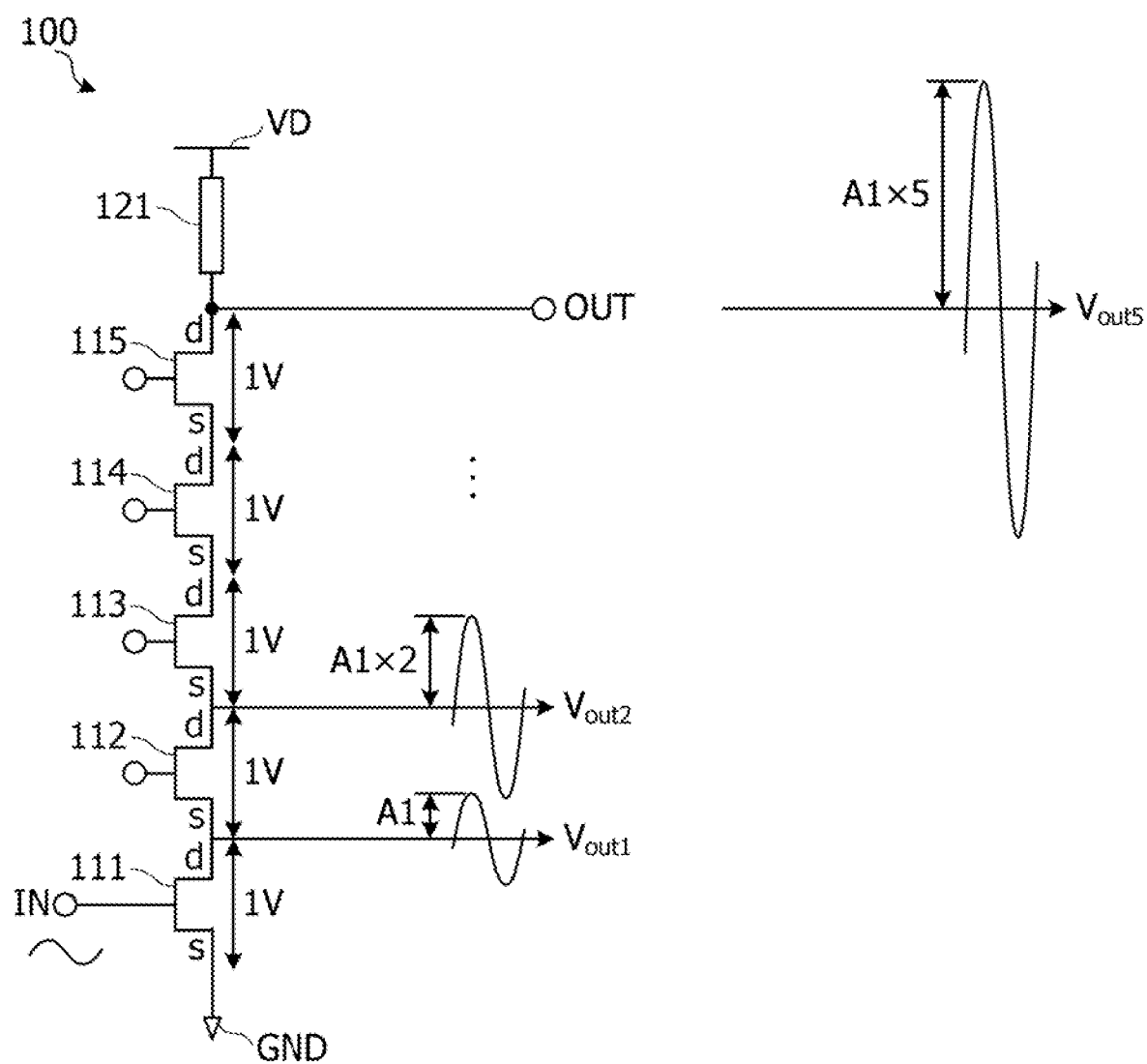
FIG. 2 is a diagram illustrating an exemplary configuration of an amplifier according to a comparative mode.

FIG. 2 is a diagram illustrating an exemplary configuration of an amplifier according to a comparative mode. An amplifier 100 illustrated in FIG. 2 is a low-withstand voltage CMOS device, and is formed by focusing on how to increase the voltage swing at an output terminal OUT. As an example, the amplifier 100 that includes five stages of transistors 111 to 115 stacked vertically between a ground GND and a power supply VD (for example, a five-volt power supply) is illustrated.

An input signal input from an input terminal IN is input to a gate of the lowermost-stage transistor 111, and an output voltage $V_{outS}$ is output from the output terminal OUT according to a load 121 of the uppermost-stage transistor 115. At this time, as the place in the stages rises from the first stage to the second stage, from the second stage to the third stage, and so forth, the voltage swing (potential fluctuation width) at a drain d of each transistor becomes larger.

However, since the voltage swing between the source and the drain (between s and d) of each transistor also have a voltage swing (potential fluctuations) at a source s, it becomes possible to oscillate within the withstand voltage of each transistor. For example, ideally, when the amplitude of the first-stage transistor is assumed A1 and the number of vertically stacked transistors is assumed as n (n is an integer equal to or greater than two), the output amplitude of the n-th-stage transistor, which is at the final stage, is given as the product of A1 and n (=A1×n). In this example, an amplitude A5 of the output voltage $V_{out5}$ is given as (A1×5).

Figure 3:
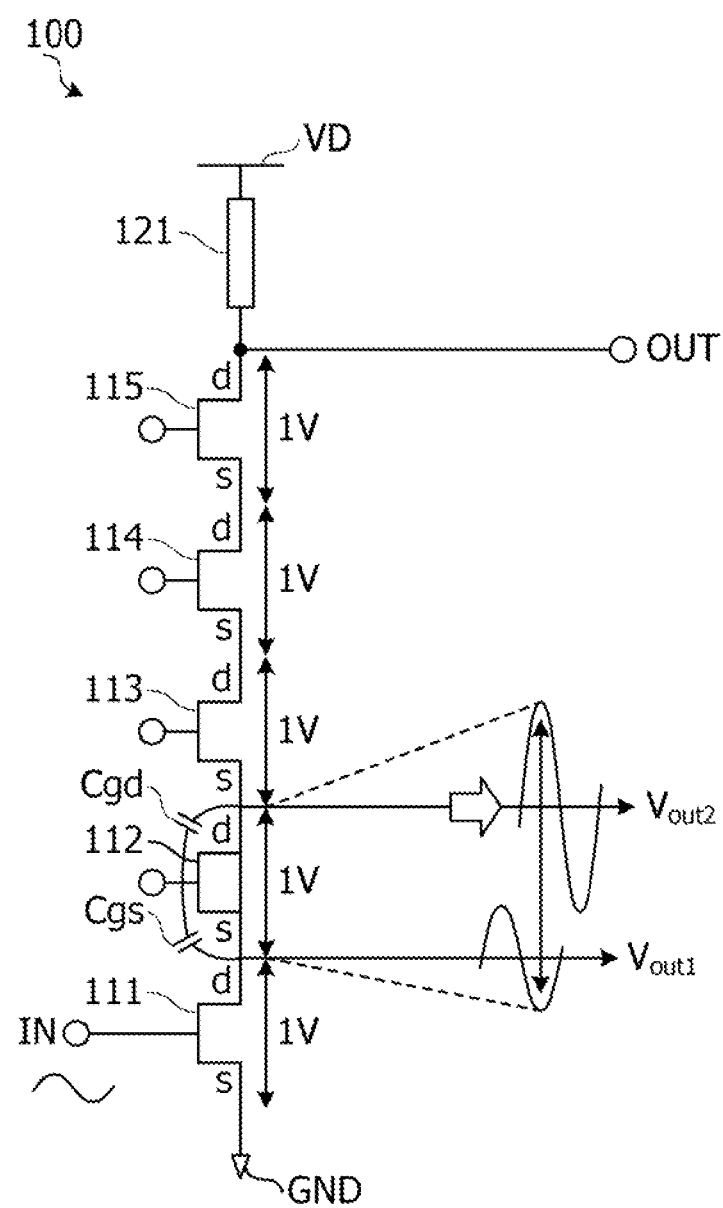
FIG. 3 is a diagram for explaining a problem in the amplifier according to the comparative mode.

FIG. 3 is a diagram for explaining a problem in the amplifier according to the comparative mode. As mentioned earlier, the voltage swing becomes larger toward the upper stage. At this time, if the respective vertically stacked transistors equally have exactly the same characteristics, the voltage between the source and drain of the transistor in each stage does not exceed the withstand voltage. However, in actual CMOS manufacturing, variations in element characteristics are regularly produced. For example, the element capacitances (a drain-source capacitance Cds, a gate-drain capacitance Cgd, and a gate-source capacitance Cgs) vary between respective stages of transistors. About several percent of the capacitance values of these element capacitances are likely to vary.

For example, when the capacitance values of the element capacitances are raised, the voltage moves in the direction of delay. Therefore, when the capacitance values are different between upper and lower transistors, delays in voltage waveforms at the source s and drain d will occur. As illustrated in FIG. 3, if the voltage waveform at the source s and the voltage waveform at the drain d have different phases, there is a possibility that the moment when the voltage between the source and the drain exceeds the element withstand voltage in one signal cycle would be produced. The element withstand voltage is more likely to be exceeded toward the upper stage. As described above, in the amplifier having the vertically stacked configuration according to the comparative mode, the element destruction is likely to occur due to variations in element capacitance values.

An amplifier of each embodiment according to the present disclosure has a vertically stacked configuration that is not easily affected by variations in element capacitance values. Next, such a configuration will be described.

Figure 4:
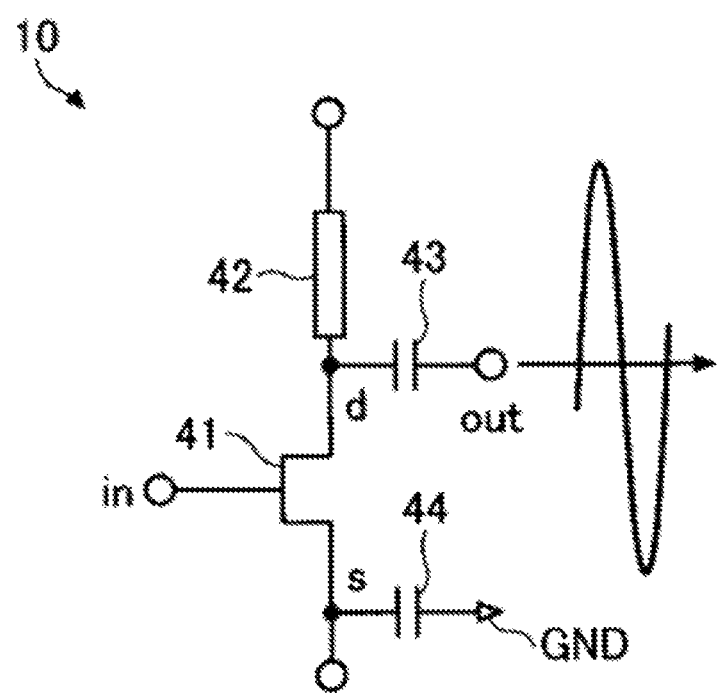
FIG. 4 is a diagram illustrating an exemplary configuration of an amplifier circuit included in an amplifier according to a first embodiment.
Figure 5:
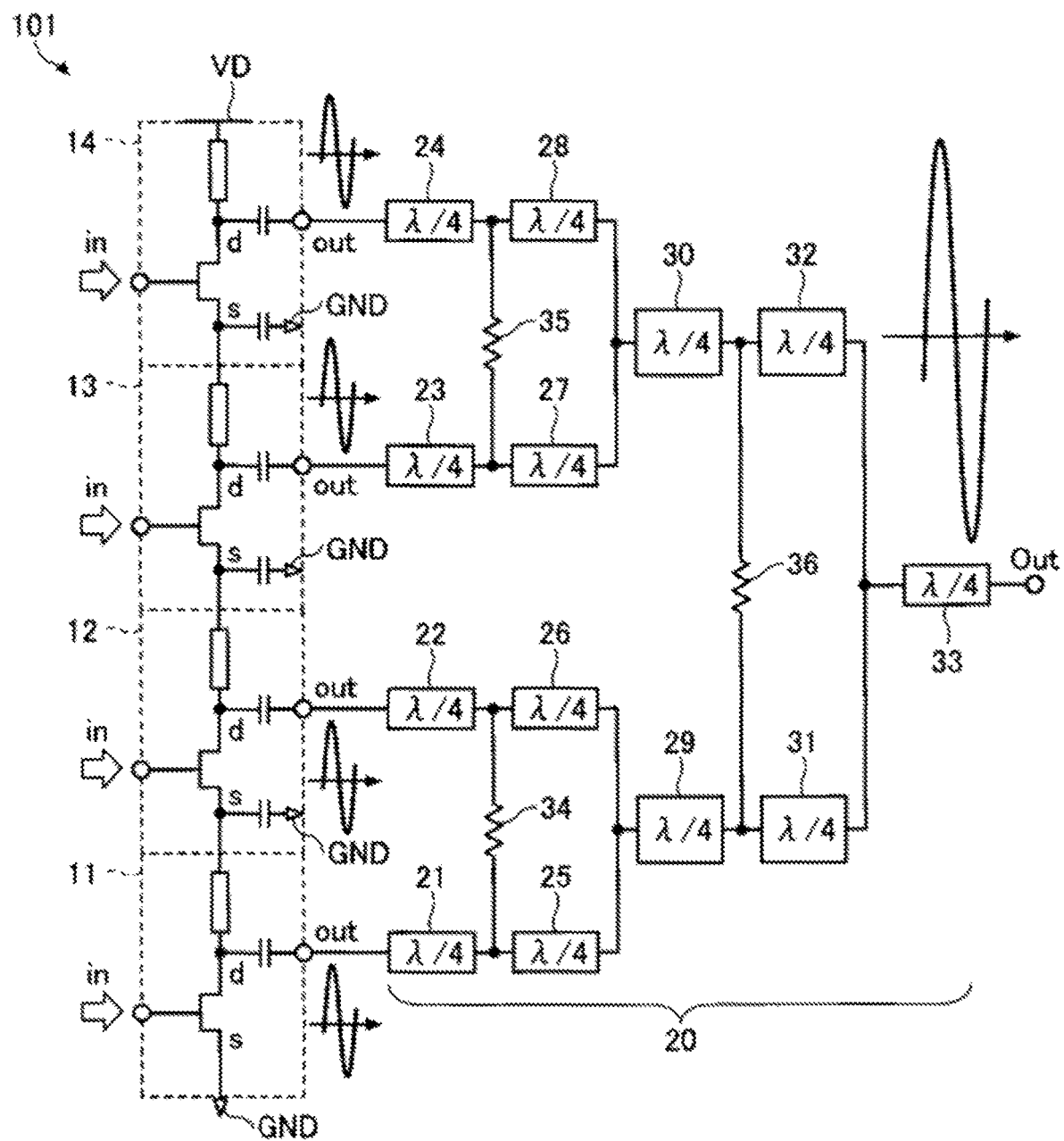
FIG. 5 is a diagram illustrating an exemplary configuration of the amplifier according to the first embodiment.

FIG. 4 is a diagram illustrating an exemplary configuration of an amplifier circuit, which is a unit configuration circuit included in an amplifier according to a first embodiment. FIG. 5 is a diagram illustrating an exemplary configuration of the amplifier according to the first embodiment.

The amplifier circuit 10 illustrated in FIG. 4 includes a transistor 41, a load 42, a capacitance 43, and a capacitance 44. The capacitance 43 is an example of a first capacitance, and the capacitance 44 is an example of a second capacitance. The load 42, one end of which is connected to a drain d of the transistor 41, is, for example, an inductor. The capacitance 43 is connected in series between the drain d of the transistor 41 and an output terminal out, and the capacitance 44 is connected in series between a source s of the transistor 41 and a ground (GND).

One end of the capacitance 43 is connected to the drain d of the transistor 41, and the capacitance 43 cuts a direct current component between the drain d and the output terminal out. The capacitance 44 has a capacitance value larger than the capacitance value of the capacitance 43. The capacitance value of the capacitance 43 is ideally infinite. The capacitance value of the capacitance 44 is preferably set to such a large value that the capacitance 44 is short-circuited at a frequency f of a signal to be amplified by the transistor 41. As a guide, an impedance Zc (=1/($\omega$C)) of the capacitance 44 has a value of 1Ω or less ($\omega$ (=2nf): angular frequency of signal, C: capacitance value). The capacitance value of the capacitance 44 may use, as a guide, a value at which the signal amplitude at the source s of the transistor 41 is 0.1 times or less the signal amplitude at the drain d of the transistor 41.

For example, when the frequency f is 28 GHz, the inductance of the load 42 is about several hundred pH (for example, 200 to 300 pH), the capacitance value of the capacitance 43 is about 0.1 pF, and the capacitance value of the capacitance 44 is about 1 pF. However, these values can be adjusted as appropriate.

An amplifier 101 illustrated in FIG. 5 includes four stages of vertically stacked amplifier circuits 11 to 14 and a combiner 20 that combines the output voltages of the respective amplifier circuits 11 to 14.

A plurality of the amplifier circuits 11 to 14 is connected in series (also referred to as "cascade-connected") between a ground and a power supply VD. Among the plurality of the amplifier circuits 11 to 14, the lowermost-stage amplifier circuit 11 has the same configuration as the configuration of the amplifier circuit 10 illustrated in FIG. 4, except that there is no capacitance 44. The amplifier circuits 12 to 14 in the upper stages except for the lowermost-stage amplifier circuit 11 each have the same configuration as the configuration of the amplifier circuit 10 illustrated in FIG. 4. The source s of the transistor 41 of the lowermost-stage amplifier circuit 11 is connected to the ground. Among the plurality of the amplifier circuits 11 to 14, the drain d of the transistor 41 of the uppermost-stage amplifier circuit 14 is connected to the power supply VD via the load 42. The uppermost-stage amplifier circuit 14 is an example of a first amplifier circuit connected closest to the power supply VD among the plurality of the amplifier circuits 11 to 14 connected in series between the ground and the power supply VD. The lowermost-stage amplifier circuit 11 is an example of a second amplifier circuit connected farthest from the power supply VD among the plurality of the amplifier circuits 11 to 14 connected in series between the ground and the power supply VD.

The uppermost-stage amplifier circuit 14 has the load 42 connected in series between the drain d of the transistor 41 and the power supply VD. Meanwhile, a plurality of the amplifier circuits 11 to 13 except for the uppermost-stage amplifier circuit 14 each has the load 42 connected between the drain d of the transistor 41 of the own amplifier circuit and the source s of the transistor 41 of an amplifier circuit adjacent to the own amplifier circuit.

A plurality of the amplifier circuits 12 to 14 except for the lowermost-stage amplifier circuit 11 each has the capacitance 44 connected between the source s of the transistor 41 and a ground. Since the capacitance 44 short-circuits a radio frequency (RF) signal, the voltage swing at the source s hardly occurs. Since the source s of the transistor 41 of the lowermost-stage amplifier circuit 11 is connected to the ground where the potential is stable, the capacitance 44 is not connected. Meanwhile, on the side of the drain d of each of the transistors 41 of the plurality of the amplifier circuits 11 to 14, the load 42 is connected. Accordingly, the voltage at the drain d of each of the transistors 41 of the plurality of the amplifier circuits 11 to 14 oscillates with an amplitude determined by the impedance of the load 42 and the current value of a current flowing between the source and the drain of the transistor 41.

The input signal (input voltage) is input in phase to the gate of the transistor 41 in each stage from respective input terminals. Meanwhile, the output signal (output voltage) is output in phase from each output terminal out. The four output signals output from the respective output terminals out of the plurality of the amplifier circuits 11 to 14 are combined in phase, for example, by the combiner 20 such as a Wilkinson combiner. As a result, an output voltage with a high output (an output voltage whose amplitude is sufficiently larger than the amplitude of the input voltage) is output from the output terminal out in the subsequent stage of the combiner 20.

The combiner 20 is a circuit connected to another end of each of the capacitances 43 of the plurality of the amplifier circuits 11 to 14 via the respective output terminals out. The combiner 20 exemplified in FIG. 5 is a 50Ω-based Wilkinson combiner that includes a plurality of matching circuits 21 to 33 and a plurality of resistors 34 to 36. The plurality of matching circuits 21 to 33 are each a transmission line having a ¼ wavelength (λ/4), and the resistors 34 to 36 are isolation resistors of 100Ω.

The number of multiple cascode-connected amplifier circuits is preferably $2^n$ (n is a natural number) in terms of facilitating the connection with the tournament-shaped combiner 20 as illustrated in FIG. 5 from the viewpoint of design and suppressing out-of-phase during signal combination, but an even number may be employed. FIG. 5 illustrates the case of n=2. The number of multiple cascode-connected amplifier circuits may be an odd number equal to or greater than three as long as the expected specifications are satisfied.

Figure 6:
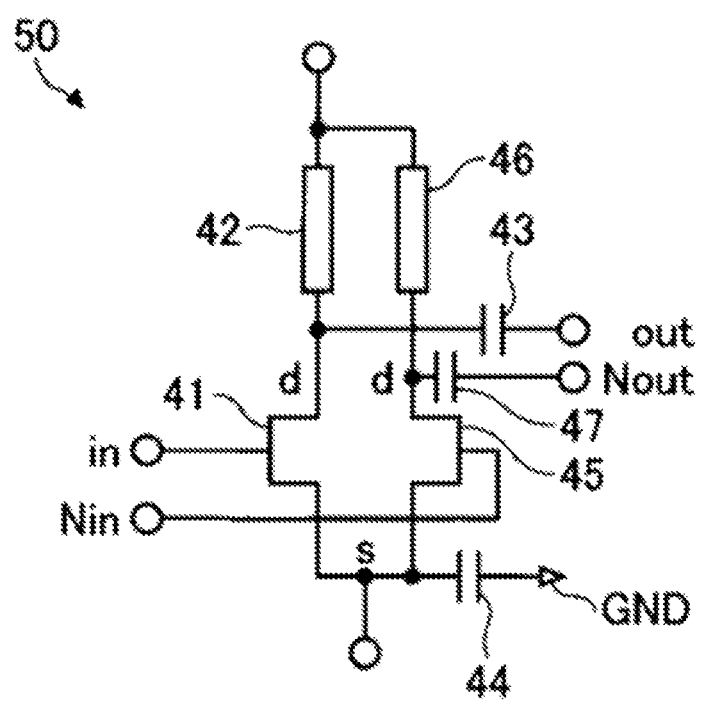
FIG. 6 is a diagram illustrating an exemplary configuration of an amplifier circuit included in an amplifier according to a second embodiment.
Figure 7:
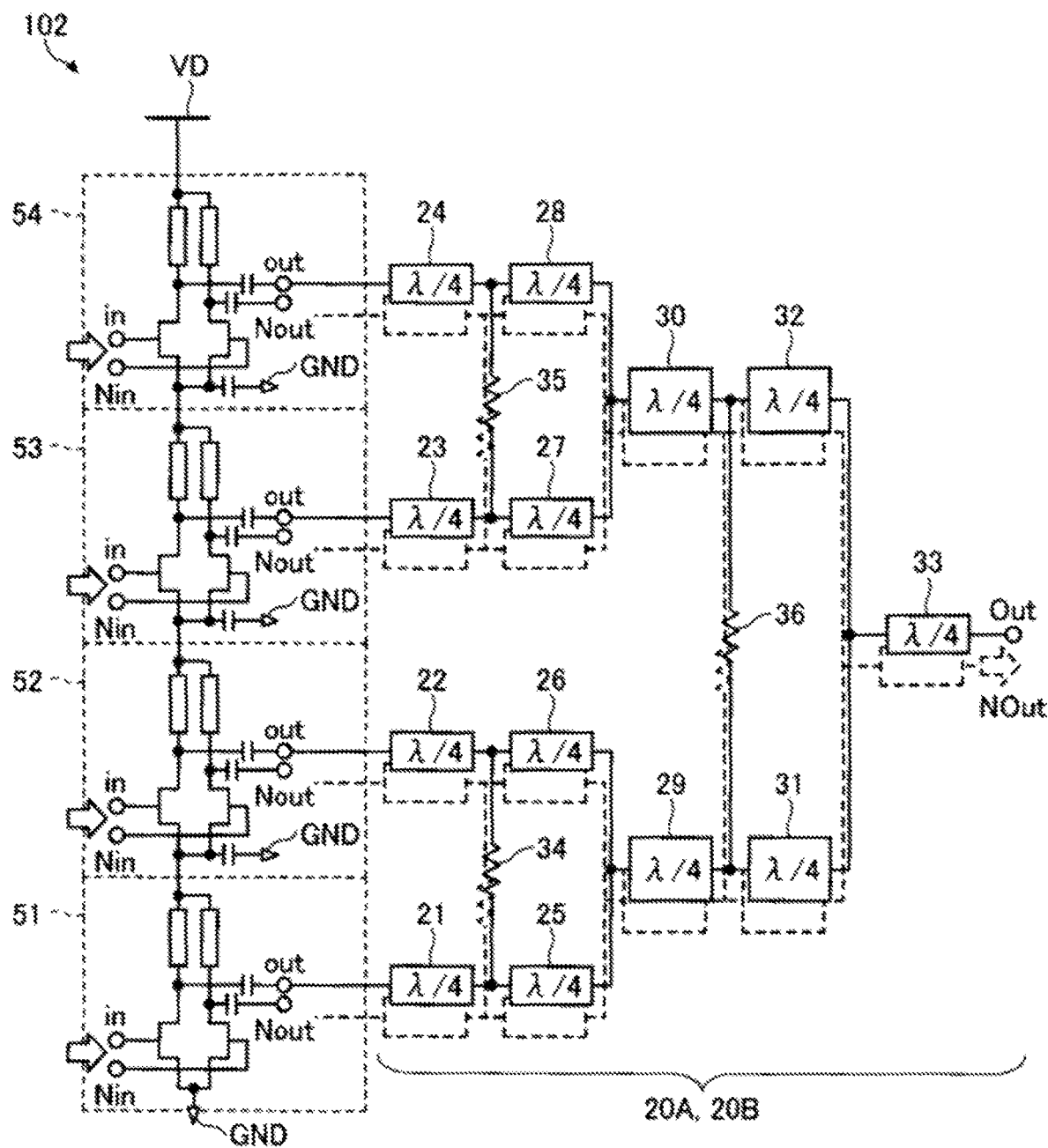
FIG. 7 is a diagram illustrating an exemplary configuration of the amplifier according to the second embodiment.

FIG. 6 is a diagram illustrating an exemplary configuration of an amplifier circuit, which is a unit configuration circuit included in an amplifier according to a second embodiment. FIG. 7 is a diagram illustrating an exemplary configuration of the amplifier according to the second embodiment. In the second embodiment, the description of a configuration similar to the configuration of the above-described embodiment will be omitted or simplified by consulting the above-mentioned description by reference. In the second embodiment, the unit configuration circuit is assumed as a differential amplifier circuit.

An amplifier circuit 50 illustrated in FIG. 6 is a differential amplifier circuit in which a transistor 45, a load 46, and a capacitance 47 are added to the configuration of the single-ended amplifier circuit 10 (the transistor 41, the load 42, and the capacitances 43 and 44) illustrated in FIG. 4. The transistor 41 is an example of a first transistor, the transistor 45 is an example of a second transistor, and the capacitance 47 is an example of a third capacitance. The load 46, one end of which is connected to a drain d of the transistor 45, is, for example, an inductor, and has the same inductance as the inductance of the load 42. Another end of the load 42 and another end of the load 46 are connected to each other. The capacitance 47 is connected in series between the drain d of the transistor 45 and an output terminal Nout. A source s of the transistor 45 is shared with the transistor 41.

One end of the capacitance 47 is connected to the drain d of the transistor 45, and the capacitance 47 cuts a direct current component between the drain d and the output terminal Nout. The capacitance 47 has a capacitance value same as the capacitance value of the capacitance 43.

An amplifier 102 illustrated in FIG. 7 includes four stages of vertically stacked amplifier circuits 51 to 54 and combiners 20A and 20B that combine the output voltages of the respective amplifier circuits 51 to 54.

A plurality of the amplifier circuits 51 to 54 is connected in series between a ground and a power supply VD. Among the plurality of the amplifier circuits 51 to 54, the lowermost-stage amplifier circuit 51 has the same configuration as the configuration of the amplifier circuit 50 illustrated in FIG. 6, except that there is no capacitance 44. The amplifier circuits 52 to 54 in the upper stages except for the lowermost-stage amplifier circuit 51 each have the same configuration as the configuration of the amplifier circuit 50 illustrated in FIG. 6. The source s of the transistors 41 and 45 of the lowermost-stage amplifier circuit 51 is connected to the ground. In the uppermost-stage amplifier circuit 54 among the plurality of the amplifier circuits 51 to 54, the drain d of the transistor 41, which is one of a differential pair, is connected to the power supply VD via the load 42, and the drain d of the transistor 45, which is the other of the differential pair, is connected to the power supply VD via the load 46. The uppermost-stage amplifier circuit 54 is an example of the first amplifier circuit connected closest to the power supply VD among the plurality of the amplifier circuits 51 to 54 connected in series between the ground and the power supply VD. The lowermost-stage amplifier circuit 51 is an example of the second amplifier circuit connected farthest from the power supply VD among the plurality of the amplifier circuits 51 to 54 connected in series between the ground and the power supply VD.

The uppermost-stage amplifier circuit 54 has the load 46 connected in series between the drain d of the transistor 45 and the power supply VD. Meanwhile, a plurality of the amplifier circuits 51 to 53 except for the uppermost-stage amplifier circuit 54 each has the load 46 connected between the drain d of the transistor 45 of the own amplifier circuit and the source s of the transistor 45 of an amplifier circuit adjacent to the own amplifier circuit.

A plurality of the amplifier circuits 52 to 54 except for the lowermost-stage amplifier circuit 51 each has the capacitance 44 connected between the source s of the transistors 41 and 45 and a ground. Since the capacitance 44 short-circuits a radio frequency (RF) signal, the voltage swing at the source s hardly occurs. Since the source s of the transistors 41 and 45 of the lowermost-stage amplifier circuit 51 is connected to the ground where the potential is stable, the capacitance 44 is not connected. Meanwhile, on the side of the drain d of each of the transistors 41 and 45 of the plurality of the amplifier circuits 51 to 54, the loads 42 and 46 are connected. Accordingly, the voltage at the drain d of each of the transistors 41 and 45 of the plurality of the amplifier circuits 51 to 54 oscillates with an amplitude determined by the impedance of the loads 42 and 46 and the current value of a current flowing between the source and the drains of the transistors 41 and 45.

Differential input signals are input to the transistors 41 and 45 in each stage. A positive-phase input signal (input voltage) is input in phase to the gate of the transistor 41 in each stage from positive-phase input terminals in in respective stages. An opposite-phase input signal (input voltage) is input in phase to a gate of the transistor 45 in each stage from opposite-phase input terminals Nin in respective stages. Meanwhile, differential output signals are output from the transistors 41 and 45 in each stage. A positive-phase output signal (output voltage) is output in phase from a positive-phase output terminal out in each stage. An opposite-phase output signal (output voltage) is output in phase from an opposite-phase output terminal Nout in each stage. The four positive-phase output signals output from the respective output terminals out of the plurality of the amplifier circuits 51 to 54 are combined in phase by the combiner 20A. The four opposite-phase output signals output from the respective output terminals Nout of the plurality of the amplifier circuits 51 to 54 are combined in phase by the combiner 20B. As a result, differential output voltages with a high output (differential output voltages whose amplitude is sufficiently larger than the amplitude of the input voltages) are output from a pair of the output terminals out and Nout in the subsequent stage of the combiners 20A and 20B.

The combiner 20A is a circuit connected to another end of each of the capacitances 43 of the plurality of the amplifier circuits 51 to 54 via the respective output terminals out. The combiner 20B is a circuit connected to another end of each of the capacitances 47 of the plurality of the amplifier circuits 51 to 54 via the respective output terminals Nout. The combiners 20A and 20B have the same configuration as each other and form one combiner. The combiners 20A and 20B are allowed to have the same configuration as the configuration of the combiner 20 illustrated in FIG. 5, for example.

Figure 8:
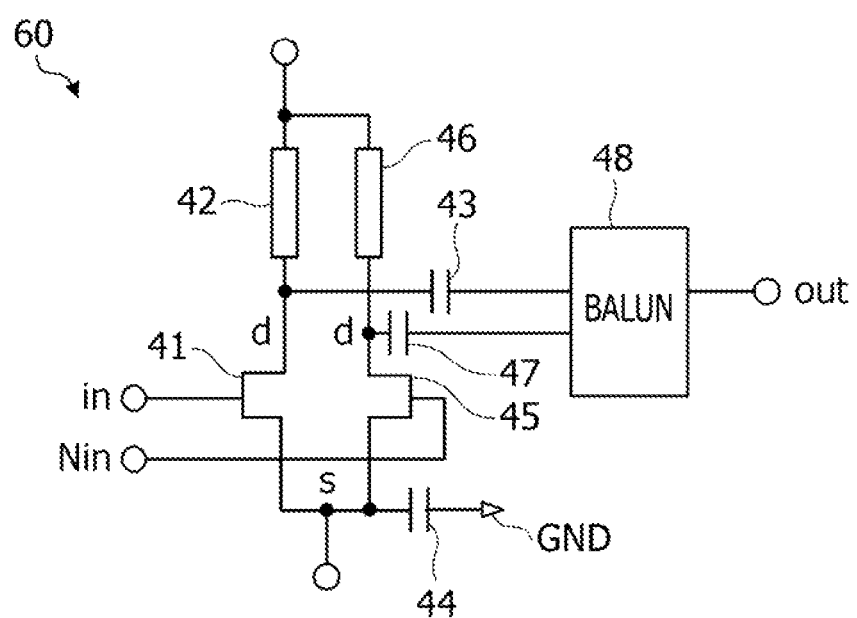
FIG. 8 is a diagram illustrating an exemplary configuration of an amplifier circuit included in an amplifier according to a third embodiment.
Figure 9:
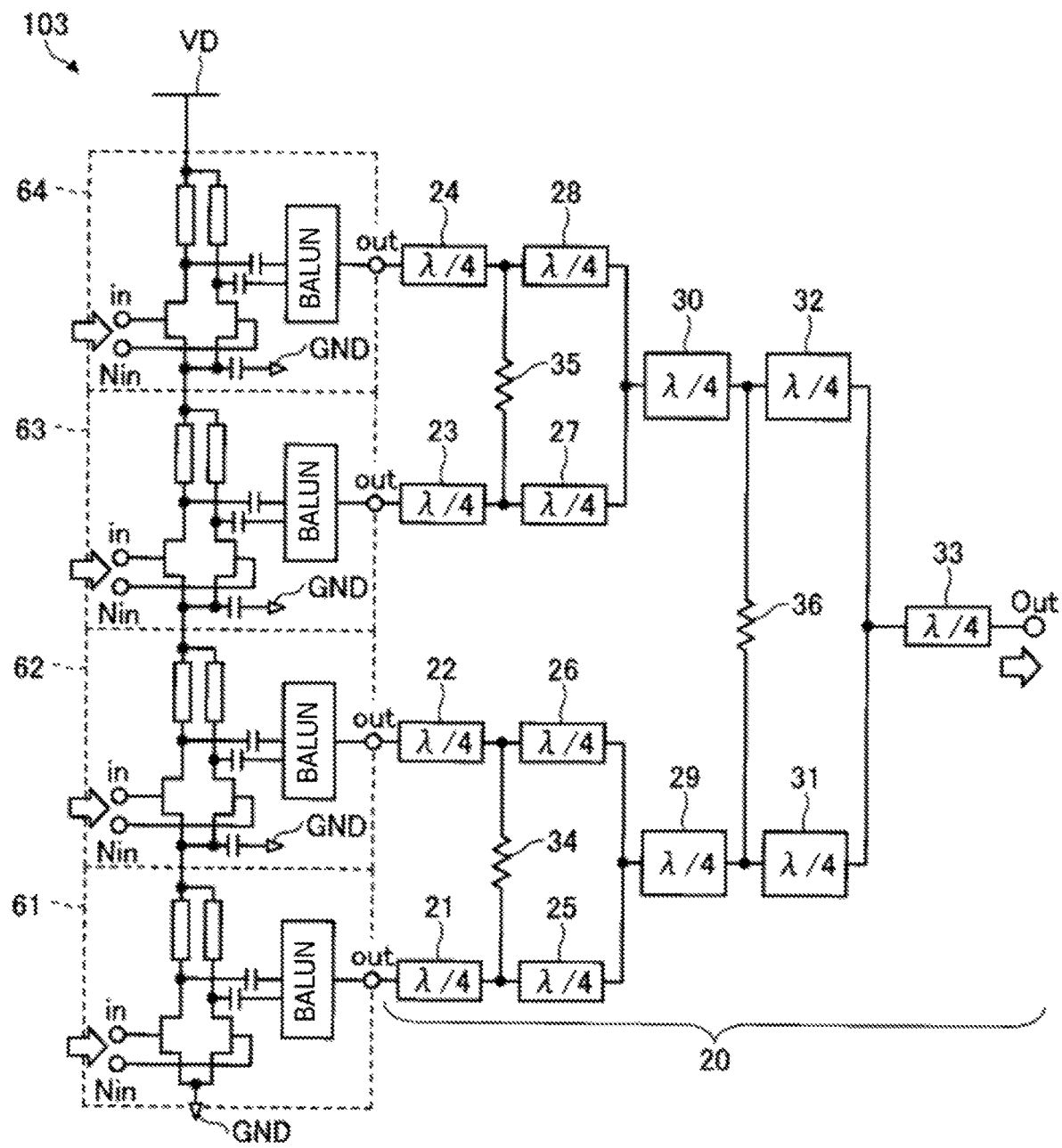
FIG. 9 is a diagram illustrating an exemplary configuration of the amplifier according to the third embodiment.

FIG. 8 is a diagram illustrating an exemplary configuration of an amplifier circuit, which is a unit configuration circuit included in an amplifier according to a third embodiment. FIG. 9 is a diagram illustrating an exemplary configuration of the amplifier according to the third embodiment. In the third embodiment, the description of a configuration similar to the configuration of the above-described embodiments will be omitted or simplified by consulting the above-mentioned description by reference. In the third embodiment, the differential outputs of the unit configuration circuits are combined in a single phase with a balun. With this configuration, four differential signals may be combined by a single-phase combiner 20, and a single-phase (single-ended) output signal may be generated.

An amplifier circuit 60 illustrated in FIG. 8 is a differential input-single-ended output amplifier circuit in which a balun 48 is added to the configuration of the amplifier circuit 50 illustrated in FIG. 6. The balun 48 is an element that converts a differential signal into a single-ended signal, and specific examples of this element include a balun transformer or the like. The balun transformer has a primary coil and a secondary coil, One end of the primary coil is connected to another end of a capacitance 43, and another end of the primary coil is connected to another end of a capacitance 47. One end of the secondary coil is connected to an output terminal out, and another end of the secondary coil is connected to a ground.

An amplifier 103 illustrated in FIG. 9 includes four stages of vertically stacked amplifier circuits 61 to 64 and the combiner 20 that combines the output voltages of the respective amplifier circuits 61 to 64.

A plurality of the amplifier circuits 61 to 64 is connected in series between a ground and a power supply VD. Among the plurality of the amplifier circuits 61 to 64, the lowermost-stage amplifier circuit 61 has the same configuration as the configuration of the amplifier circuit 60 illustrated in FIG. 8, except that there is no capacitance 44. The amplifier circuits 62 to 64 in the upper stages except for the lowermost-stage amplifier circuit 61 each have the same configuration as the configuration of the amplifier circuit 60 illustrated in FIG. 8. The source s of transistors 41 and 45 of the lowermost-stage amplifier circuit 61 is connected to the ground.

The amplifier 103 includes the combiner 20 that is connected to the other end of each of the capacitances 43 of the plurality of the amplifier circuits 61 to 64 and the other end of each of the capacitances 47 of the plurality of the amplifier circuits 61 to 64 via relevant baluns 48. The configuration in FIG. 9 to which the baluns 48 are added is advantageous in terms of wiring design and miniaturization because the area occupied by the combiner 20 is shrunk compared with the configuration in FIG. 7.

Figure 10:
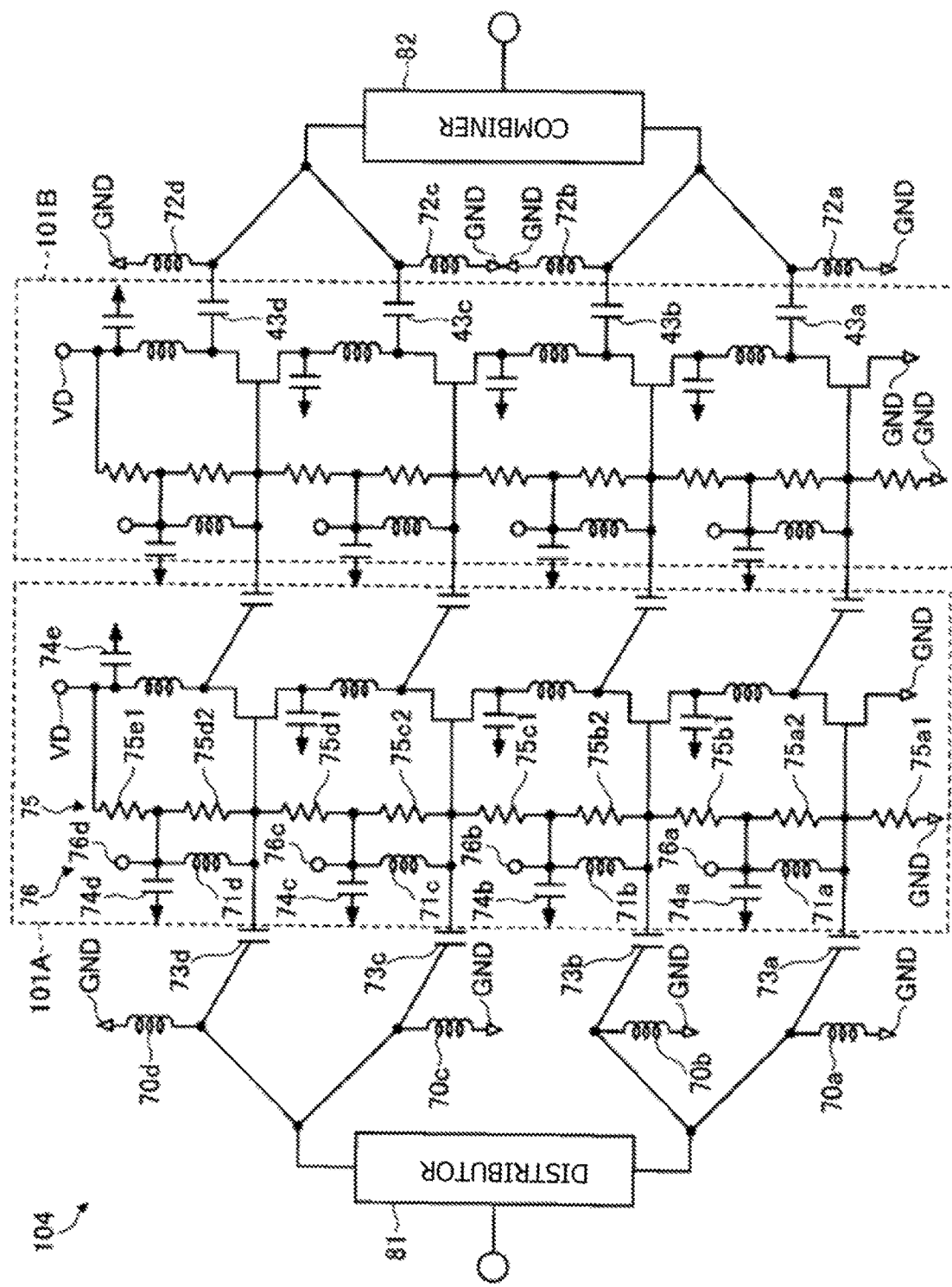
FIG. 10 is a diagram illustrating an exemplary configuration of an amplifier according to a fourth embodiment.

FIG. 10 is a diagram illustrating an exemplary configuration of an amplifier according to a fourth embodiment. In the fourth embodiment, the description of a configuration similar to the configuration of the above-described embodiments will be omitted or simplified by consulting the above-mentioned description by reference. In the fourth embodiment, a plurality of amplification units including a plurality of cascode-connected transistors are cascade-connected.

An amplifier 104 illustrated in FIG. 10 is a multi-stage amplifier including a plurality of cascade-connected amplification units 101A and 101B.

The amplification units 101A and 191E have the same circuit configuration as each other, and have the configuration of the amplifier 101 (the plurality of the amplifier circuits 11 to 14) illustrated in FIG. 5. The degree of amplification may be increased by cascade-connecting a plurality of cascode-connected amplifier circuits in multiple stages. FIG. 10 illustrates an example in which amplification units each having four vertically stacked amplifier circuits are connected in two stages.

Note that a plurality of the vertically stacked amplifier circuits in each amplification unit is not limited to the single-phase input and single-phase output mode as illustrated in FIG. 4, and the differential input and differential output mode as illustrated in FIG. 6 or the differential input and single-phase output mode as illustrated in FIG. 8 may be employed.

Each of the amplification units 101A and 101B has a gate bias circuit 75. The gate bias circuit 75 applies a gate bias voltage linked to the power supply voltage of a power supply VD to each gate of the plurality of the vertically stacked transistors. The gate bias circuit 75 generates each gate bias voltage by dividing the power supply voltage using, for example, resistors $75a1$, $75a2$, $75b1$, $75b2$, $75c1$, $75c2$, $75d1$, $75d2$, and $75e1$. A capacitance $74e$ inserted in series between the power supply VD and a ground smooths the direct current power supply voltage.

The amplification units 101A and 101B may each include a bias adjustment circuit 76. The bias adjustment circuit 76 adjusts the gate bias voltage applied to each gate of the plurality of the vertically stacked transistors. The bias adjustment circuit 76 has a plurality of matching circuits provided for each gate of the plurality of the vertically stacked transistors and connected to the relevant gates. In FIG. 10, as the plurality of matching circuits, an LC circuit constituted by a capacitance $74a$ and an inductor $71a$, an LC circuit constituted by a capacitance $74b$ and an inductor $71b$, an LC circuit constituted by a capacitance $74c$ and an inductor $71c$, and an LC circuit constituted by a capacitance $74d$ and an inductor $71d$ are exemplified. The capacitances $74a$ to $74d$ have a capacitance value approximately same as the capacitance value of a capacitance connected between a source and a ground of each of the plurality of the vertically stacked transistors.

Control nodes 76a to 76d configured to input a bias control voltage for controlling the gate bias voltage from the outside of the amplifier 104 to each of the plurality of matching circuits may be connected to the plurality of matching circuits in one-to-one correspondence. The bias control voltage is supplied from, for example, a digital-to-analog converter (DAC) (not illustrated).

The amplifier 104 includes a distributor 81 that distributes single-ended input signals supplied from the outside, in phase to respective input terminals of the plurality of the amplifier circuits in the amplification unit 101A on the input side. The distributor 81 is connected to each input terminal of the plurality of the amplifier circuits in the amplification unit 101A on the input side via a plurality of input matching circuits. In FIG. 10, as the plurality of input matching circuits, an LC circuit constituted by a capacitance 73a and an inductor 70a, an LC circuit constituted by a capacitance 73b and an inductor 70b, an LC circuit constituted by a capacitance 73c and an inductor 70c, and an LC circuit constituted by a capacitance 73d and an inductor 70d are exemplified. The distributor 81 is, for example, a Wilkinson distributor.

The amplifier 104 includes a combiner 82 that combines four output signals output from respective output terminals of the plurality of the amplifier circuits in the amplification unit 101B on the output side, in phase. The combiner 82 is connected to each output terminal of the plurality of the amplifier circuits in the amplification unit 101B on the output side via a plurality of output matching circuits. In FIG. 10, as the plurality of output matching circuits, an LC circuit constituted by a capacitance 43a and an inductor 72a, an LC circuit constituted by a capacitance 43b and an inductor 72b, an LC circuit constituted by a capacitance 43c and an inductor 72c, and an LC circuit constituted by a capacitance 43d and an inductor 72d are exemplified. The combiner 82 is, for example, a Wilkinson combiner.

As described above, according to the above-described embodiment, in each of the plurality of the vertically stacked transistors, the voltage swing at a source s is suppressed to almost zero, and the voltage at a drain d oscillates. For example, since the high-frequency signal is short-circuited by a capacitance 44 connected between the source s and the ground, the vertically stacked neighboring transistors are isolated from each other at a high frequency. Accordingly, each of the plurality of the vertically stacked amplifier circuits operates as a source-grounded amplifier circuit. As a result, in the transistor in each stage, even if the voltage waveform at the source and the voltage waveform at the drain have different phases due to variations in element capacitance, an excessive voltage swing generated between the source and the drain may be suppressed. This means that an amplifier that is not easily affected by variations in transistor capacitance values may be provided.

Figure 11:
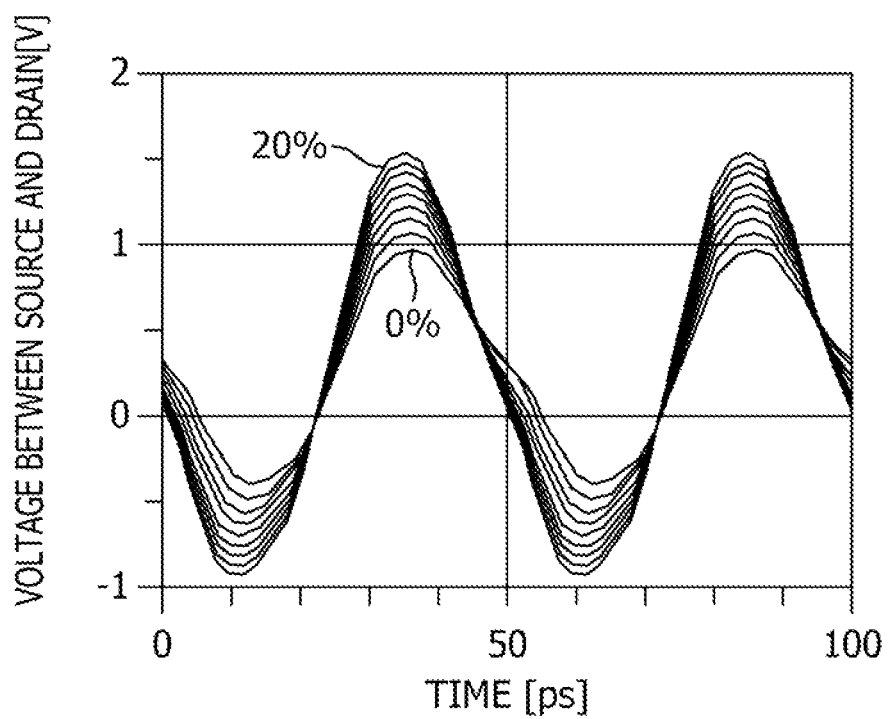
FIG. 11 is a diagram illustrating an example of a simulation result for the amplifier according to the comparative mode.
Figure 12:
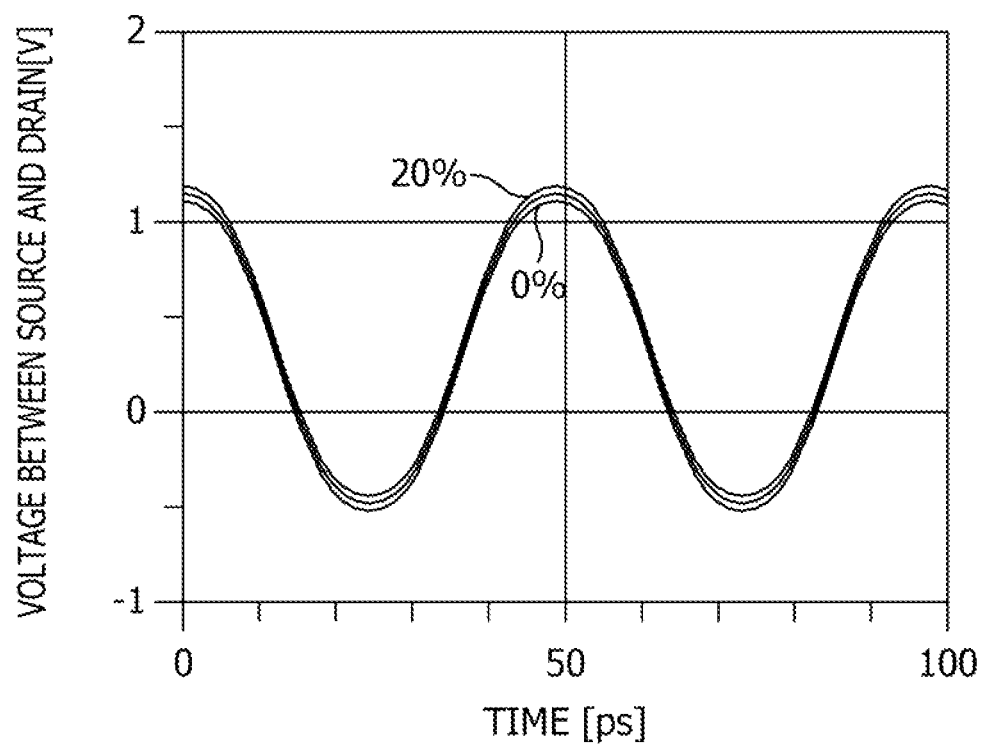
FIG. 12 is a diagram illustrating an example of a simulation result for the amplifier according to the first embodiment.

FIG. 11 is a diagram illustrating an example of a simulation result for the amplifier (the amplifier 100 in FIG. 2) according to the comparative mode. FIG. 12 is a diagram illustrating an example of a simulation result for the amplifier (the amplifier 101 in FIG. 5) according to the first embodiment. FIGS. 11 and 12 both illustrate the voltage waveforms between the source and the drain of the transistor in the second stage from the bottom when an input capacitance Cgs of the second-stage transistor is raised from 0% to 20%. Furthermore, FIGS. 11 and 12 illustrate a case where the plurality of the vertically stacked transistors is generated by a CMOS process. According to FIGS. 11 and 12, even if the input capacitance Cgs is raised by 20%, in the amplifier 101 according to the first embodiment, an excessive voltage swing generated between the source and the drain of the transistor in the second stage from the bottom is suppressed, compared with the amplifier 100 according to the comparative mode.

While the embodiments have been described thus far, the technology of the present disclosure is not restricted to the above-described embodiments. Various modifications and improvements such as combination and replacement with some or all of other embodiments may be allowed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An amplifier comprising a plurality of amplifier circuits connected in series between a ground and a power supply, wherein each of the plurality of amplifier circuits includes:
   a transistor; and
   a first capacitance, one end of which is connected to a drain of the transistor, a first amplifier circuit connected closest to the power supply among the plurality of amplifier circuits includes a load connected between the drain of the transistor and the power supply, each of the plurality of amplifier circuits except for the first amplifier circuit includes a load connected between the drain of the transistor of an own amplifier circuit and a source of the transistor of an amplifier circuit adjacent to the own amplifier circuit, each of the plurality of amplifier circuits except for an amplifier circuit connected farthest from the power supply includes a second capacitance connected between the source of the transistor and the ground, and the second capacitance has a capacitance value larger than a capacitance value of the first capacitance,
   when the transistor is used as the first transistor, each of the plurality of amplifier circuits includes: a second transistor, of which a source is shared with the first transistor, and a third capacitance, one end of which is connected to a drain of the second transistor, the first amplifier circuit includes a load connected between the drain of the second transistor and the power supply, and each of the plurality of amplifier circuits except for the first amplifier circuit includes a load connected between the drain of the second transistor of an own amplifier circuit and the source of the second transistor of an amplifier circuit adjacent to the own amplifier circuit.

2. The amplifier according to claim 1, wherein a number of the plurality of amplifier circuits is an even number.

3. The amplifier according to claim 2, wherein a number of the plurality of amplifier circuits is $2^n$, where n is a natural number.

4. The amplifier according to claim 1, wherein impedance of the second capacitance is 1Ω or less at a frequency of a signal to be amplified by the transistor.

5. The amplifier according to claim 1, wherein the capacitance value of the second capacitance is a value at which a signal amplitude at the source of the transistor is 0.1 times or less a signal amplitude at the drain of the transistor.

6. The amplifier according to claim 1, further comprising a combiner connected to another end of the first capacitance of each of the plurality of amplifier circuits.

7. The amplifier according to claim 1, further comprising a combiner connected to another end of the first capacitance of each of the plurality of amplifier circuits and another end of the third capacitance of each of the plurality of amplifier circuits.

8. The amplifier according to claim 7, wherein the combiner is connected to the other end of the first capacitance of each of the plurality of amplifier circuits and the other end of the third capacitance of each of the plurality of amplifier circuits via a balun.

9. A multi-stage amplifier comprising:
a plurality of amplifiers that is cascade-connected, wherein each of the plurality of amplifiers includes a plurality of amplifier circuits connected in series between a ground and a power supply, wherein each of the plurality of amplifier circuits includes:
a transistor; and
a first capacitance, one end of which is connected to a drain of the transistor, a first amplifier circuit connected closest to the power supply among the plurality of amplifier circuits includes a load connected between the drain of the transistor and the power supply, each of the plurality of amplifier circuits except for the first amplifier circuit includes a load connected between the drain of the transistor of an own amplifier circuit and a source of the transistor of an amplifier circuit adjacent to the own amplifier circuit, each of the plurality of amplifier circuits except for an amplifier circuit connected farthest from the power supply includes a second capacitance connected between the source of the transistor and the ground, and the second capacitance has a capacitance value larger than a capacitance value of the first capacitance, when the transistor is used as the first transistor, each of the plurality of amplifier circuits includes: a second transistor, of which a source is shared with the first transistor, and a third capacitance, one end of which is connected to a drain of the second transistor, the first amplifier circuit includes a load connected between the drain of the second transistor and the power supply, and each of the plurality of amplifier circuits except for the first amplifier circuit includes a load connected between the drain of the second transistor of an own amplifier circuit and the source of the second transistor of an amplifier circuit adjacent to the own amplifier circuit.

10. The multi-stage amplifier according to claim 9, further comprising: a distributor connected to an input side of the plurality of amplifiers; and a combiner connected to an output side of the plurality of amplifiers.

* * * * *